United States Patent
Priel et al.

(10) Patent No.: US 8,363,504 B2
(45) Date of Patent: Jan. 29, 2013

(54) DEVICE AND METHOD FOR STATE RETENTION POWER GATING

(75) Inventors: Michael Priel, Hertzelia (IL); Dan Kuzmin, Givat Shmuel (IL); Anton Rozen, Gedera (IL)

(73) Assignee: Freescale Semiconductor, Inc., Austin, TX (US)

( * ) Notice: Subject to any disclaimer, the term of this patent is extended or adjusted under 35 U.S.C. 154(b) by 556 days.

(21) Appl. No.: 12/595,372

(22) PCT Filed: Apr. 20, 2007

(86) PCT No.: PCT/IB2007/051444
§ 371 (c)(1),
(2), (4) Date: Oct. 9, 2009

(87) PCT Pub. No.: WO2008/129362
PCT Pub. Date: Oct. 30, 2008

(65) Prior Publication Data
US 2010/0202235 A1    Aug. 12, 2010

(51) Int. Cl.
*G11C 5/14* (2006.01)
(52) U.S. Cl. ......... 365/229; 365/226; 365/227; 365/228
(58) Field of Classification Search .................. 365/154, 365/226–229, 236; 327/142
See application file for complete search history.

(56) References Cited

U.S. PATENT DOCUMENTS

| | | |
|---|---|---|
| 6,169,419 B1 | 1/2001 | De et al. |
| 6,437,623 B1 | 8/2002 | Hsu et al. |
| 6,977,519 B2 | 12/2005 | Bhavnagarwala et al. |
| 8,095,809 B2 * | 1/2012 | Priel et al. ............... 713/320 |
| 2004/0008056 A1 | 1/2004 | Kursun et al. |
| 2006/0255849 A1 | 11/2006 | Chun |
| 2009/0003114 A1 * | 1/2009 | Priel et al. ............... 365/227 |

FOREIGN PATENT DOCUMENTS

| | | |
|---|---|---|
| WO | 2005/054884 A1 | 6/2005 |
| WO | 2006/100455 A2 | 3/2006 |

OTHER PUBLICATIONS

Henzler S et al: Dynamic State-Retention Flipflop for Fine-Grained Sleep-Transistor Scheme Solid-State Circuits Conference, 2005. European, IEEE, Piscataway, NJ, Sep. 12, 2005, pp. 145-148.
International Search Report and Written Opinion correlating to PCT/IB2007/051444 dated Jan. 16, 2009.

* cited by examiner

*Primary Examiner* — Kretelia Graham

(57) ABSTRACT

A device for state retention power gating, the device includes a group of circuits, each circuit is characterized by a reset state, wherein the device is characterized by including: a first memory entity adapted to save during a shut down period of the group circuits, at least one location of at least one non-reset-state circuit of the group of circuits.

20 Claims, 8 Drawing Sheets receiving a shut down indication indicative of a shut down of a group of circuits, each circuit is characterized by a reset state
710 counting a number of reset-state circuits that precede a non-reset-state circuit
730 determining, by a non-reset state identifier, the at least one location.
720 saving during a shut down period, at a first memory entity, in response to the shut down indication, location information indicative of at least one location of at least one non-reset state circuit out of the group of circuits
740 sending to a second memory entity additional location information if the first memory entity is prevented from storing the additional location information
750 sending, after a shut down period ends, a non-reset-state indication to a non-reset state circuit
760

700

Figure 7 receiving a shut down indication indicative of a shut down of a group of circuits, each circuit is characterized by a reset state
710 providing, via a scan chain, to a non-reset-state identifier, information representative of states of circuits of the group of circuits.
735 saving during a shut down period, by a counter, in response to the shut down indication, location information indicative of the location of a non-reset-state circuit out of the group of circuits
745 sending, after a shut down period ends, a non-reset-state indication to a non-reset-state circuit
760

DEVICE AND METHOD FOR STATE RETENTION POWER GATING

FIELD OF THE INVENTION

The present invention relates to device and method for state retention power gating of transistor-based systems.

BACKGROUND OF THE INVENTION

Mobile devices, such as but not limited to personal data appliances, cellular phones, radios, pagers, lap top computers, and the like are required to operate for relatively long periods before being recharged. These mobile devices usually include one or more processors as well as multiple memory modules and other peripheral devices.

The power consumption of a transistor-based device is highly influenced by leakage currents that flow through the transistor. The leakage current is responsive to various parameters including the threshold voltage (Vt) of the transistor, the temperature of the transistor and the like. Transistors that have higher Vt are relatively slower but have lower leakage currents while transistors that have lower Vt are relatively faster but have higher leakage current.

In order to reduce the power consumption of mobile devices various power consumption control techniques were suggested. A first technique includes reducing the clock frequency of the mobile device. A second technique is known as dynamic voltage scaling (DVS) or alternatively is known as dynamic voltage and frequency scaling (DVFS) and includes altering the voltage that is supplied to a processor as well as altering the frequency of a clock signal that is provided to the processor in response to the computational load demands (also referred to as throughput) of the processor. Higher voltage levels are associated with higher operating frequencies and higher computational load but are also associated with higher energy consumption.

A third technique uses domino circuits that include both high threshold voltage transistors and low threshold voltage transistors. U.S. patent application number 2004/0008056 of Kursun et al., which is incorporated herein by reference, discloses a domino circuit that is configured such as to reduce power consumption, for example by limiting the energy consumed during power switching.

Yet another technique is based upon creating a stack effect that involves shutting down multiple transistors of the same type that are serially connected to each other. U.S. Pat. No. 6,169,419 of De et al., which is incorporated herein by reference, discloses a method and apparatus for reducing standby leakage current using a transistor stack effect. De describes a logic that has both a pull up path and a pull down path.

There is a growing need to find effective devices and methods for reducing power consumption of integrated circuits.

SUMMARY OF THE PRESENT INVENTION

A device and a method for state retention power gating of a group of circuits, as described in the accompanying claims.

BRIEF DESCRIPTION OF THE DRAWINGS

The present invention will be understood and appreciated more fully through the following detailed description taken in conjunction with the drawings in which:

FIG. 7 is a flow diagram of a method according to an embodiment of the invention; and FIG. 8 is a flow diagram of a method according to another embodiment of the invention.

DETAILED DESCRIPTION OF PREFERRED EMBODIMENTS

The following description relates to data fetch operations and to a data cache module. Those skilled in the art will appreciate that the disclosed systems and methods can be modified to instruction retrieval, instruction cache module, and even to a combination of data and instruction retrieval and to cache modules that store both instructions and data.

Figure 1:
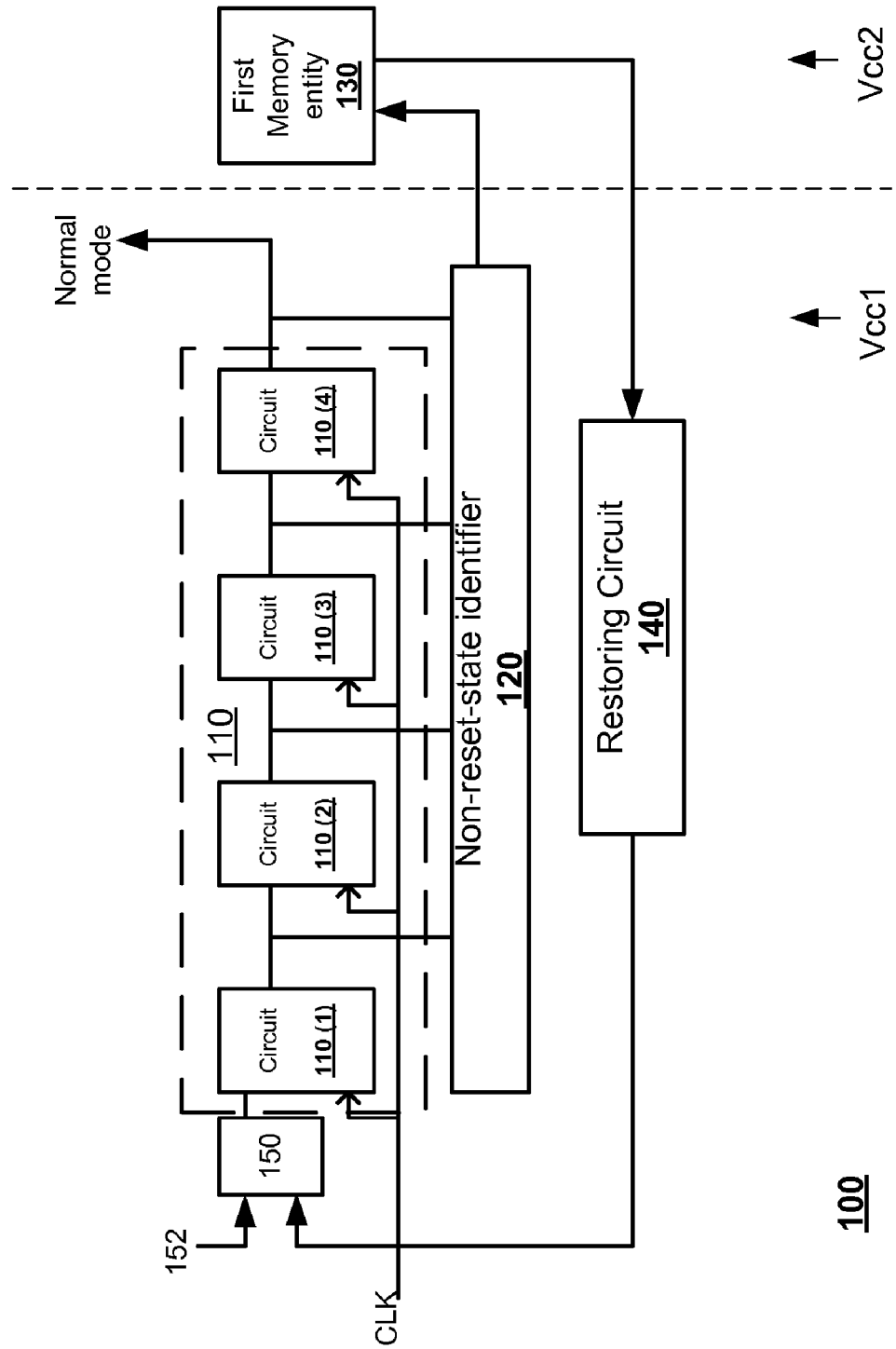
FIG. 1 is a schematic diagram of a device, according to an embodiment of the invention.

FIG. 1 illustrates device 100 for state retention power gating according to an embodiment of the invention. Device 100 includes: (i) group of circuits 110(1) to 110(4), each circuit is characterized by a reset state, (ii) non-reset-state identifier 120, (iii) restoring circuit 140, (iv) first memory entity 130 and (v) selector 150. It is noted that although circuits 110(1)-110(4) as well as other circuits in following figures are illustrated as flip-flops that the state of circuits of other types can be saved.

First memory entity 130 is adapted to save during a shut down period of the group circuits, at least one location of at least one non-reset-state circuit of the group of circuits.

Circuits 110(1)-110(4) are conveniently connected to each other via a normal path (that usually include multiple logic components between each pair of circuits) and via a scan path. It is noted that these circuits can be connected to each other in other manners. Circuits 110(1)-110(4) receive a first clock signal (CLK) and are fed by a first supply voltage Vcc1. CLK is usually halted and Vcc1 is not provided during a shut down period. Circuits 110(1)-110(4) are illustrated as flip-flops but other circuits can be included in device 100. It is noted that the clock signal can differ according to the operational mode (normal, low power, scan or other mode) of device 100.

A reset state is the state to which a circuit converges after exiting from a shut down period. The reset state of a circuit is known in advance, and can also be validated by resetting the circuits and checking their reset state. This information is further used by the non-reset-state identifier 120.

Device 100 further includes non-reset-state identifier 120 for determining at least one location of a circuit out of group 110 that, before entering a shut down period, is not in a reset state.

Non-reset-state identifier 120 can include one or more counters, one or more comparators and the like. Non-reset-state identifier 120 can be designed according to the number of circuits expected to concurrently be in a non-reset-state.

Non-reset-state identifier 120 can receive the outputs of circuits of group 110 in various manners including serial and parallel manners. A serial connectivity can be provided via a (one or more) scan chains that include circuits 110(1)-110(4). Conveniently, circuits 110(1)-110(4) can belong to the same scan chain and this scan chain is connected to first memory entity 130. It is noted that circuits 110(1)-110(4) can be connected to each other in various other manners.

Non-reset-state identifier 120 is connected to first memory entity 130 for sending to first memory entity 130 location information representative of the location of non-reset-state circuit 110. Non-reset-state identifier 120 is triggered in response to a low power mode start indication. Non-reset-state identifier 120 can also monitor the transfer of non-reset-state information during a "Scan-out" process, if any non-reset data still exists in the chain and stops if all non-reset data was driven out and its locations were saved in "130".

Device 100 further includes restoring circuit 140 that assists in restoring the state of circuits 110(1)-110(4) to their state prior the shut down. Restoring circuit 140 receives the location information and accordingly can feed the correct signals to circuits 110(1)-110(4).

Restoring circuit 140 is triggered in response to shut down end indication such as a low power mode end indication. Restoring circuit 140 is connected to first memory entity 130 in order to receive the location information that represents the locations of at least one non-reset-state circuits out of the group of circuits 110(1)-110(4). Restoring circuit 140 can serve as an input channel to group 110. Selector 150 can select between providing the output of restoring circuit 140 to group 110 or providing another input 152. The other input can be provided after the state of circuits 110(1)-110(4) is restored to their state prior the shut down period.

First memory entity 130 is connected to non-reset-state identifier 120 for saving the location information. First memory 130 is connected to the restoring circuit 140 for sending the non-reset-state indication to the non-reset-state circuit, after a low power mode end indication. It is noted that restoring circuit 140 can send a sequence of signals (representative of the location information) to group 110 in which this sequence propagates till reaching the appropriate circuits.

Conveniently, the size of first memory entity 130 is smaller than the aggregate size of the group of circuits. Conveniently, first memory entity 130 consumes less power than group 110. It can be implemented by slower transistors or otherwise less power consuming elements (for example by having a higher threshold voltage or by applying other techniques).

Vcc1 is a power supply for the group of circuits 110(1)-110(4). Vcc2 is a power supply for the first unit entity 130. Low power mode start indication alerts power shut down of Vcc1. During the shut down of Vcc1, Vcc2 supplies power to the first memory unit 130 thus the location information. Vcc2 can be shut off when Vcc1 is provided (for example during normal (or functional) operational mode of device 100).

FIG. 1 shows group 110 as including four flip-flops. It is noted that group 110 can include more than four flip-flops, fewer than four flip-flops, as well as circuits that differ from flip-flops.

Conveniently, the paths through which state information propagates to first memory entity 130 and/or the length of paths that restore the state can be dynamically altered in order to reduce the propagation time of this information. The alteration can be responsive to the location of the non-reset-state circuits. This can be done by designing paths that can include sections that can be selectively bypassed. For example, assuming that the only non-reset-state circuit is circuit 110(1) then its state can be propagated through a path that will bypass circuits 110(2)-110(3) as well as bypass the scan chains connected between these bypassed circuits. If the restoring can be done in parallel (in relation to circuits 110(1)-110(4)) then such parallel restoring can also amount in a change of the actual length that the restored state propagates.

It is noted that there can be multiple first memory entity per re-configurable path.

It is further noted that multiple voltage supplies can be provided to circuits 110(1)-110(4), and that one or more voltage supply can be provided per operational mode.

Conveniently, circuits 110(1)-110(4) can have state retention power gating capabilities, thus a portion of these circuits can receive power during a certain operational mode of device 100 while another portion of these circuits is shut down.

It is further noted that circuits 110(1)-110(4) can de connected via chains that differ from chain scans and that circuits 110(1)-110(4) can connected to different scan chains.

Figure 2:
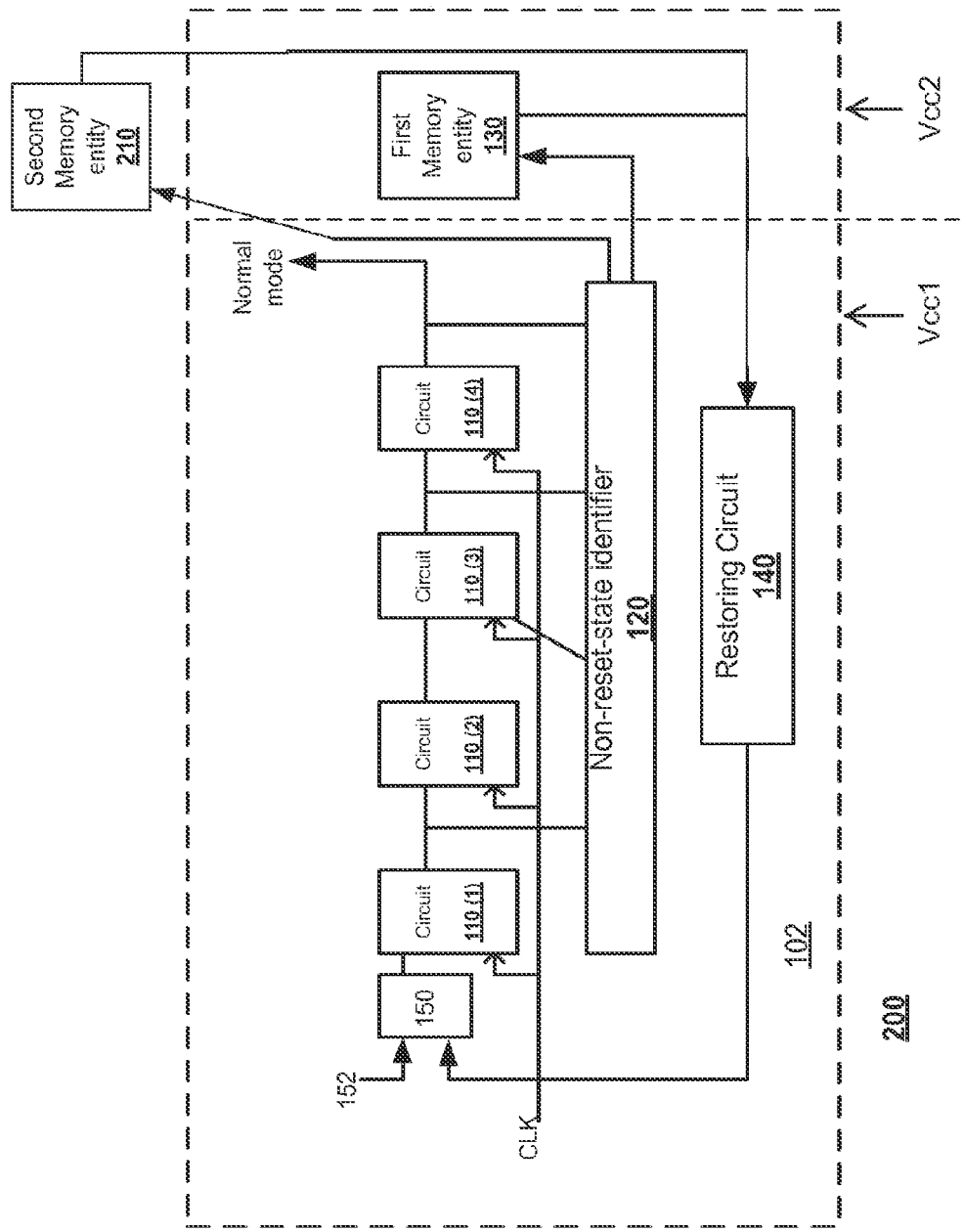
FIG. 2 is a schematic diagram illustrating a different embodiment of the invention.

FIG. 2 illustrates a device 200 according to another embodiment of the invention. Device 200 of FIG. 2 differs from device 100 of FIG. 2 by including second memory entity 210.

It is assumed that group 110, non-reset-state identifier 120, restoring circuit 140 and first memory entity 130 belong to integrated circuit 102. Second memory entity 210 can be included within integrated circuit 102 but can also be located outside integrated circuit 102 but connected to integrated circuit 102.

Second memory entity 210 can receive location information that can not be stored within first memory entity 130, especially due size limitations of first memory entity 130. First memory entity 130 can decide when to send this additional location information to second memory entity 210, although non-reset-state identifier 120 can also determine when first memory entity can not receive the information and can send the additional location information directly to second memory entity 210. If, for example, first memory entity 130 can store location information that identifies a single non-reset-state circuit of group 110 then in cases that multiple non-reset-state circuits of group 110 are in a non-reset-state prior to a shut-down then second memory entity 210 can receive location information representative of the locations of the second (or even more) non-reset-state circuits.

Second memory unit 210 is connected to the non-reset-state identifier 120 for saving the at least one other location of a non-reset-state circuit and is also connected to the restoring circuit 140 for sending the at least one other location of a non-reset-state indication to the non-reset-state, after a low power mode end indication. Alternately, in different embodiments of the invention second memory entity is connected only with first memory entity 130. Thus, the update of second memory entity 210 and retrieval of data from second memory entity is performed only via first memory entity 130. Second memory entity 210 can also be shared between several first memory entities. In this case second memory entity 210 will also save "source memory" information (which first memory entity provided the location information).

Figure 3:
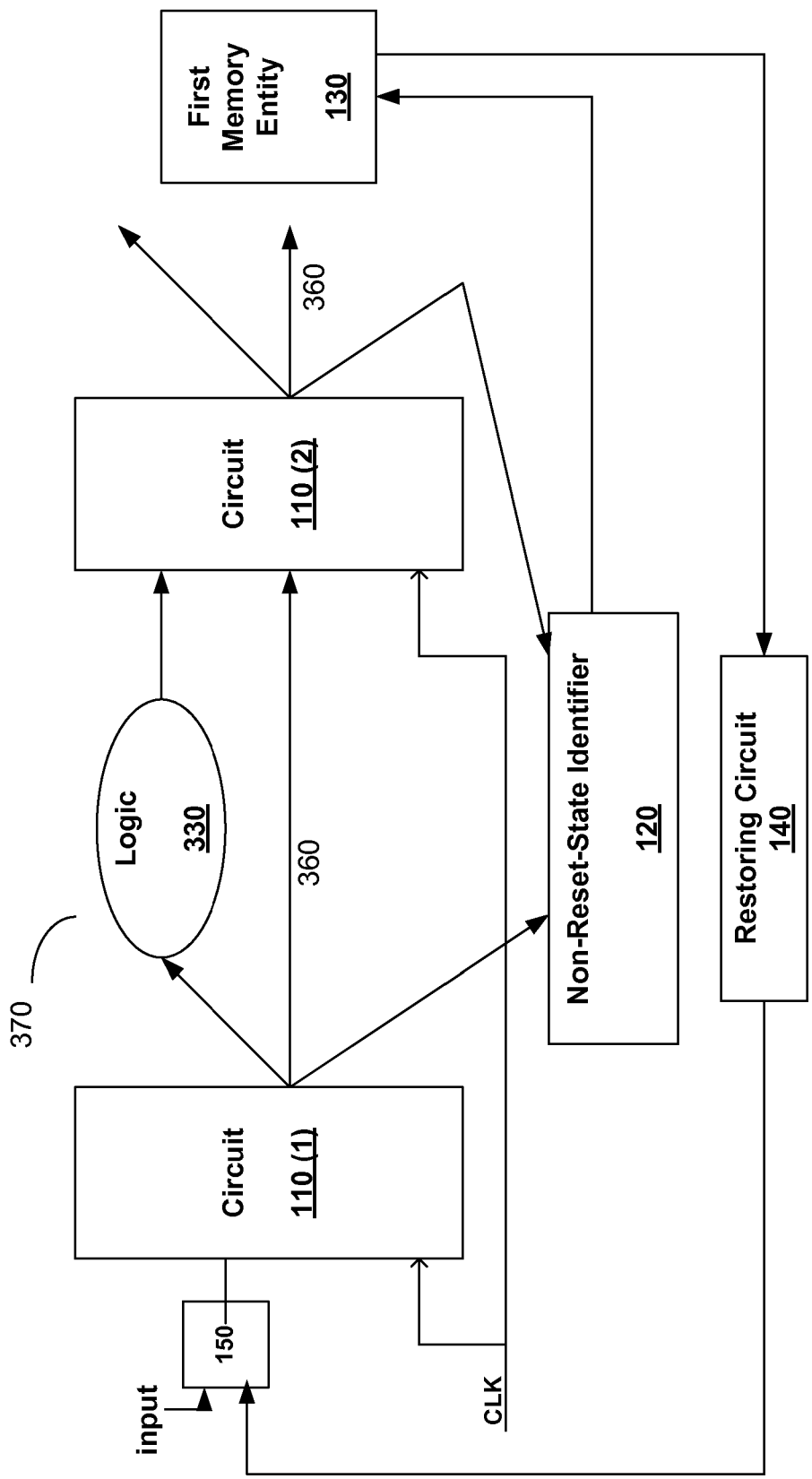
FIG. 3 is a schematic diagram illustrating a connectivity between a pair of circuits according to an embodiment of the invention.

FIG. 3 is a schematic diagram illustrating connectivity between circuits 110(1) and 110(2) according to an embodiment of the invention.

Circuits 110(1) and 110(2) are connected via scan path 360. Circuits 110(1) and 110(2) are further connected via a normal path that includes logic 330.

Conveniently, non-reset-state identifier 120 is connected to circuits 110(1) and 110(2) via their scan paths (or other way). Non-reset-state identifier 120 is further connected to first memory entity 130 for saving location information indicative of a location of at least one non-reset-state circuit of group 110.

Restoring circuit 140 is connected to first memory entity 130 for retrieval of the location information. Restoring circuit 140 also provides input to the group of circuits via selector 150.

Figure 4:
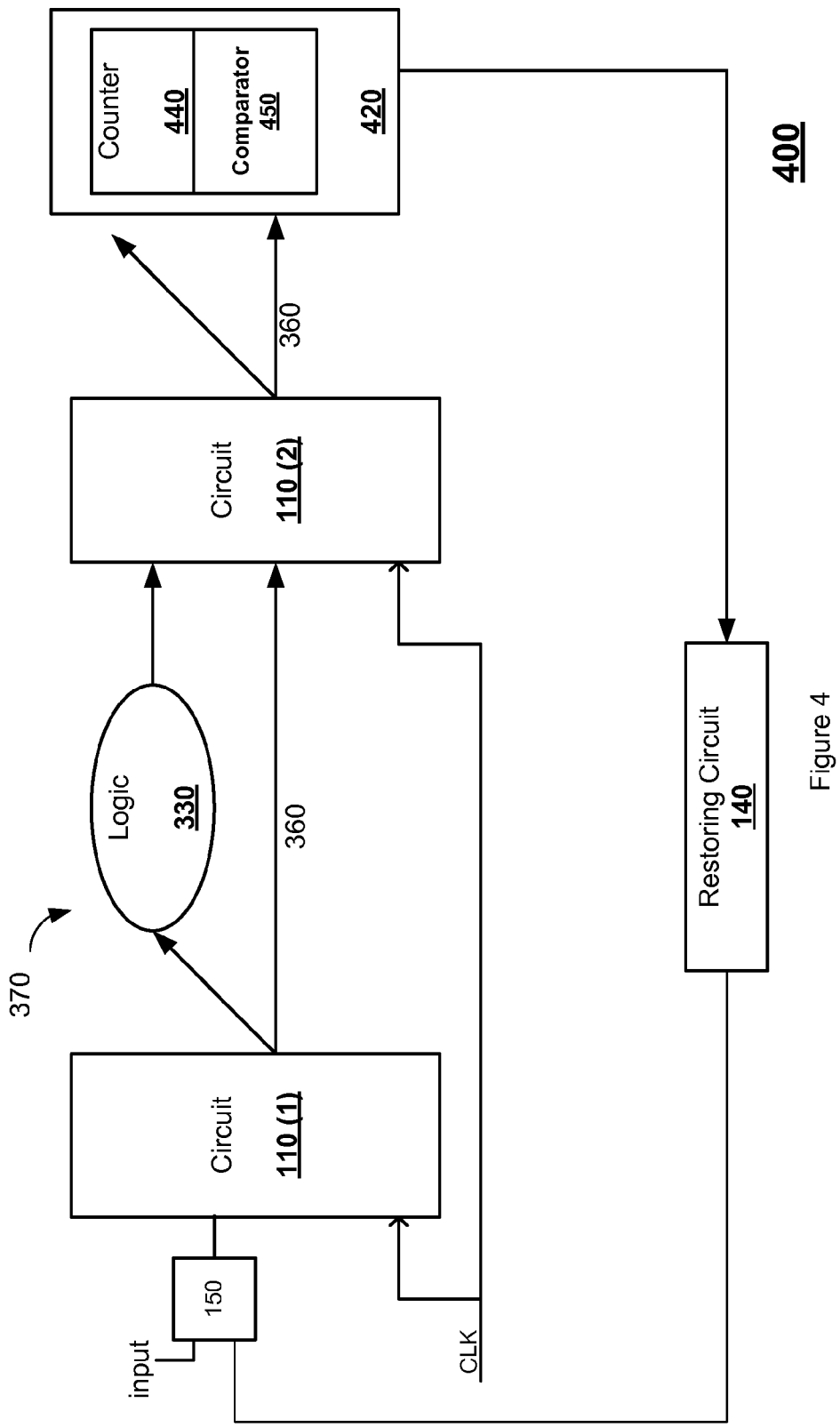
FIG. 4 is a schematic diagram illustrating a device according to another embodiment of the invention.

FIG. 4 is a schematic diagram illustrating device 400 according to another embodiment of the invention.

FIG. 4 illustrates circuit 110(1), circuit 110(2), logic 330, selector 150, restoring circuit 140 and combined memory and non-non-reset-state identifier circuit 420. For simplicity of explanation it is assumed that combined memory and non-reset-state identifier circuit 420 is adapted to detect a single non-reset-state circuit of group 110. The detection of multiple non-reset-state circuit and storing location information representative of multiple non-reset-state circuits requires more complex circuitry than that is illustrated in FIG. 4.

Combined memory and non-reset-state identifier circuit 420 receives state information of group 110 in a serial manner, on state after the other. It counts (by counter 440) the number of clock cycles from the beginning of the reception of the state information until a non-reset state indication is received (to be detected by comparator 450). Once such an indication is received counter 440 is halted. By using more counters the locations of multiple non-reset-state circuits can be detected and saved.

Restoring circuit 140 is connected to counter 440 for retrieval of the location of the non-reset-state circuit. Restoring circuit 140 also provides input to the group of circuits via selector 150.

Figure 5:
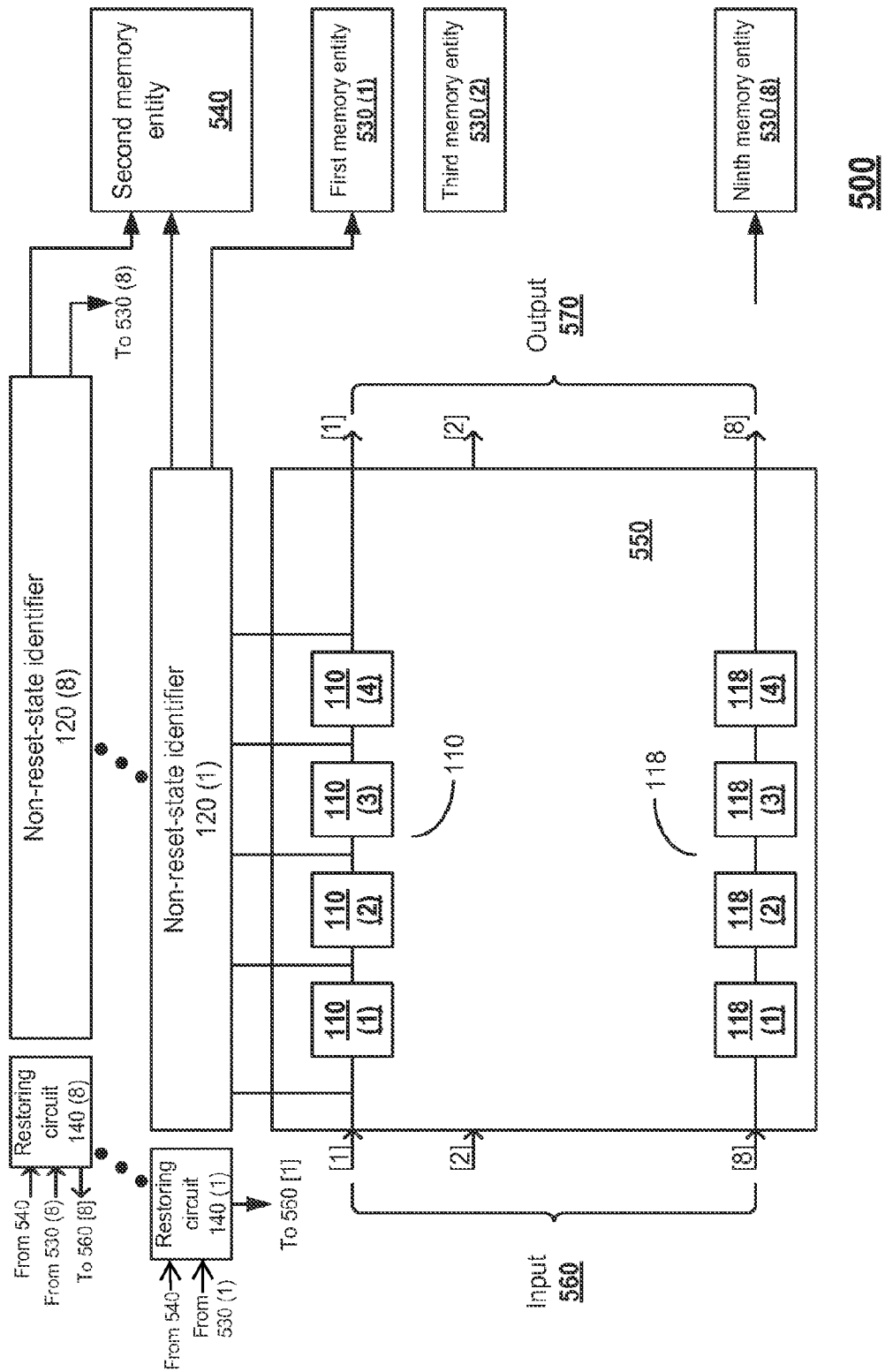
FIG. 5 is a schematic illustration of a device according to an embodiment of the invention.

FIG. 5 is a schematic illustration of device 500 according to an embodiment of the invention. Device 500 includes a set 550 of eight groups of circuits 110 to 118 wherein each group includes four circuits. Circuits 110(1) to 110(4) belong to first group 110, wherein circuit 110(1) is connected to an input 560[1] of set 550 and circuit 110(4) is connected to an output 570[1] of set 550. Circuits 118(1) to 118(4) belong to eighth group 118, wherein circuit 118(1) is connected to an input 560[8] of set 550 and circuit 118(4) is connected to an output 570[8] of set 550.

Each group is connected to a corresponding non-reset-state identifier 120(1) to 120(8) conveniently via scan chain connection. Each of the non-reset-state identifiers 120(1) to 120(8) is further connected to a corresponding memory entity. Non-reset-state identifier 120(1) is connected to first memory entity 530(1), non-reset-state identifier 120(8) is connected to ninth memory entity 530(8).

Each of non-reset-state identifiers 120(1) to 120(8) is further connected to second memory entity 540. It is noted that more than a single second memory entity can exist. Alternately, in a different embodiment of the invention the non-reset-state identifiers are not connected to second memory entity 540. In such an embodiment second memory 140 is accessed via the dedicated memory entities 530(1) to 530(8).

Device 500 further includes restoring circuits 140(1) to 140(8) wherein each restoring circuits is connected to its corresponding group of circuits and a memory entity. Thus, restoring circuit 140(1) is connected to group of circuits 110 and to first memory entity 530(1). Restoring circuit 140(8) is connected to group of circuits 118 and to ninth memory entity 530(8). Each of the restoring circuits 140(1) to 140(8) is further connected to second memory entity 540. Alternately, in a different embodiment of the invention second memory entity 540 is accessed via the dedicated memory entities 530(1) to 530(8). Hence, in such a configuration restoring circuits 140(1) to 140(8) are not connected to second memory entity 540.

Second memory entity 540 is connected to the non-reset-state identifiers 120(1) to 120(8) and further connected to restoring circuits 140(1) to 140(8). In a different embodiment of the invention second memory 540 is connected only with the dedicated memory entities 530(1) to 530(8) with a bi-directional link for update and retrieval.

Non-reset-state identifiers 120 determine the at least one location of at least one non-reset-state circuit within the group of circuits 110 to 118. Non-reset-state identifier 120(1) determines the at least one location of at least one non-reset-state circuit within group of circuits 110(1).

Memory entities 530(1) to 530(8) are adapted to save during a shut down period of the group circuits, location information representative of a location of at least one non-reset-state circuit of their corresponding group of circuits. Each group of circuits 110 to 118 is connected to its dedicated memory entity.

Second memory entity 540 can store location information that can not be stored (usually due to size constraints as well as other possible constraints) in first memory entity 530(1), third till ninth memory entities 530(2)-530(8).

Restoring circuits 140 are adapted to send, after the shut down period ends, a non-reset-state indication to a non-reset-state circuit related to the group of circuits corresponding to the restoring circuit. Thus, restoring circuit 140(1) sends a non-reset-state indication to non-reset-state circuits within group of circuits 110. The above description is only an example of an embodiment of the invention thus is should be noted that the number of circuits in a group is not limited nor is the number of groups.

Figure 6:
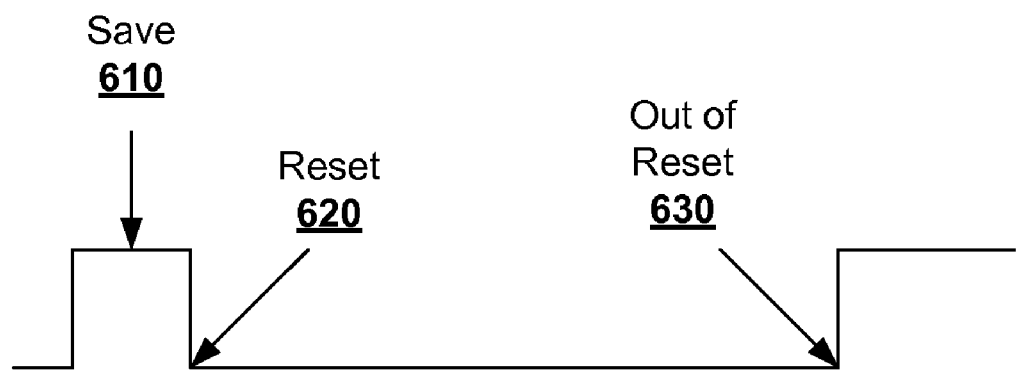
FIG. 6 is a diagram illustrating the circuit power states according to an embodiment of the invention.

FIG. 6 is a diagram illustrating the circuit power states according to an embodiment of the invention. At point 610 low power mode start indication is received. The low power mode indication is received prior to the shut down of the power to the group of circuits. The non-reset-state circuits are identified by the non-reset-state identifier and saved in the first memory entity. At point 620 the power supply to the group of circuits is shut down. The group of circuits enters a reset state until a low power mode end indication 630 is received. During the shut down period power is supplied to the memory entities. After low power mode indication 630 is received the group of circuits starts receiving power and the non-reset-state indication is sent to the non-reset-state circuit.

FIG. 7 is a flow diagram of method 700 for state retention power gating according to an embodiment of the invention.

Method 700 starts with stage 710 of receiving a shut down indication indicative of a shut down of a group of circuits, each circuit is characterized by a reset state wherein a reset state is the state of a circuit during no power supply. The reset states of all circuits including the group of circuits is known and saved.

Stage 710 is followed by stage 720 of determining, by a non-reset-state identifier, the at least one location of a non-reset-state circuit. Upon receipt of a low power start indication non-reset-state identifier scans the group of circuits and for each circuit including the group it compares the state of a circuit with the circuit's saved reset state.

Stage 720 conveniently includes stage 730 of counting a number of reset-state circuits that precede a non-reset-state circuit. Alternately, to cover cases whereby there are more than one non-reset-state circuits, stage 730 is characterized by counting the number of circuits that precede each of the non-reset-state circuits. It is noted that is parallel connectivity enables to detect the location without counting, especially if each circuit is connected in parallel to a non-reset-state identifier.

Stage 720 is followed by stage 740 of saving, during a shut down period, at a first memory entity, in response to the shut down indication, location information indicative of at least one location of at least one non-reset-state circuit out of the group of circuits. The size of the first memory entity is smaller than the aggregate size of the group of circuits.

Stage 740 is followed by stage 750 of sending to a second memory entity location information of at least one other non-reset-state circuit if the first memory entity is prevented from storing the at least one other location. In a different embodiment of the invention wherein there are several groups of circuits the second memory entity serves all groups of circuits.

Stage 750 is followed by stage 760 of sending, after a shut down period ends, a non-reset-state indication to a non-reset-state circuit.

This process is initiated on each receipt of a low power mode start indication.

FIG. 8 is a flow diagram of method 702 for state retention power gating according to another embodiment of the invention.

Method 702 starts with stage 710 of receiving a shut down indication indicative of a shut down of a group of circuits, each circuit is characterized by a reset state wherein a reset state is the state of a circuit during no power supply. The reset states of all circuits including the group of circuits is known and saved.

Stage 710 is followed by stage 735 of providing, via a scan chain (or by other means), to a non-reset-state identifier, information representative of states of circuits of the group of circuits. The non-reset-state identifier compares the state of a circuit with the circuit's saved reset value. A counter counts the number of clocks preceding the receipt of a non-reset-state by the non-reset-state identifier.

Stage 735 is followed by stage 745 of saving during a shut down period, by a counter, in response to the shut down indication, location information indicative of a location of a non-reset-state circuit of the group of circuits. The size of the counter is smaller than the aggregate size of the group of circuits.

Stage 745 is followed by stage 760 of sending, after a shut down period ends, a non-reset-state indication to a non-reset-state circuit.

This process is initiated on each receipt of a low power mode start indication.

Variations, modifications, and other implementations of what is described herein will occur to those of ordinary skill in the art without departing from the spirit and the scope of the invention as claimed. Accordingly, the invention is to be defined not by the preceding illustrative description but instead by the spirit and scope of the following claims.

We claim:

1. A device for state retention power gating, the device comprises:
    a group of circuits, each circuit is characterized by a reset state and by a non-reset state;
    a first memory entity adapted to save during a shut down period of the group circuits, at least one location of at least one non-reset-state circuit of the group of circuits; wherein a non-reset-state circuit is in a non-reset state before entering the shut down period.

2. The device according to claim 1 further comprising a non-reset-state identifier for determining the at least one location.

3. The device according to claim 2 wherein the circuits of the group of circuits are connected in a serial manner; wherein the non-reset-state identifier comprises a counter adapted to determine a location of a first non-reset state circuit of the at least one non-reset state circuit by counting a number of reset-state circuits that precede the first non-reset-state circuit.

4. The device according to claim 1 further comprising a restoring circuit adapted to send, after the shut down period ends, a non-reset-state indication to a non-reset-state circuit.

5. The device according to claim 1 wherein the device comprises an integrated circuit that comprises the first memory entity and wherein the device further comprises a second memory entity coupled to the integrated circuit; wherein the device sends to the second memory entity at least one other location of at least one other non-reset-state circuit if the first memory entity is prevented from storing the at least one other location.

6. The device according to claim 2 wherein the non-reset-state identifier is triggered in response to a low power mode start indication that precedes the shut down period.

7. The device according to claim 4 wherein the restoring circuit is adapted to send the non-reset-state indication to the non-reset-state circuit in response to a low power mode end indication.

8. The device according to claim 1 further comprising a non-reset-state identifier that is coupled via at least one scan chain to the group of circuits.

9. The device according to claim 1 wherein a size of the first memory entity is smaller than an aggregate size of the group of circuits.

10. A method for state retention power gating, comprising:
    receiving a shut down indication indicative of a shut down of a group of circuits, each circuit of the group of circuits is characterized by a reset state and by a non-reset state; and
    saving during a shut down period, at a first memory entity, in response to the shut down indication, at least one location of at least one non-reset-state circuit of the group of circuits; wherein a non-reset-state circuit is in a non-reset state before entering the shut down period.

11. The method according to claim 10 further comprising determining, by a non-reset-state identifier, the at least one location.

12. The method according to claim 11 wherein the circuits of the group of circuits are connected in a serial manner and the determining comprises counting a number of reset-state circuits that precede a non-reset-state circuit.

13. The method according to claim 10 further comprising sending, after a shut down period ends, a non-reset-state indication to a non-reset-state circuit.

14. The method according to claim 10 further comprising sending to a second memory entity at least one other location of at least one other non-reset-state circuit if the first memory entity is prevented from storing the at least one other location; wherein the first memory entity is included within an integrated circuit coupled to the second memory entity.

15. The method according to claim 10 further comprising providing, via a scan chain, to a non-reset-state identifier, information representative of states of circuits of the group of circuits.

16. The method according to claim 10 further comprising saving during a shut down period, by a counter, in response to the shut down indication, one location of one non-reset-state circuit out of the group of circuits.

17. The device according to claim 1 wherein the first memory entity consumes less power than the group of circuits.

18. The device according to claim 1 wherein a path selected from a path through which state information propagates and a path that restores a state is altered.

19. The method according to claim 10 wherein the first memory entity consumes less power than the group of circuits.

20. The method according to claim 10 comprising altering a path selected from a path through which state information propagates and a path that restores a state.

* * * * *